US010782343B2

(12) United States Patent
Bodoh et al.

(10) Patent No.: US 10,782,343 B2
(45) Date of Patent: Sep. 22, 2020

(54) DIGITAL TESTS WITH RADIATION INDUCED UPSETS

(71) Applicant: NXP USA, INC., Austin, TX (US)

(72) Inventors: Daniel Joseph Bodoh, Austin, TX (US); Kent Bradley Erington, Austin, TX (US)

(73) Assignee: NXP USA, INC., Austin, TX (US)

( * ) Notice: Subject to any disclaimer, the term of this patent is extended or adjusted under 35 U.S.C. 154(b) by 140 days.

(21) Appl. No.: 15/954,650

(22) Filed: Apr. 17, 2018

(65) Prior Publication Data
US 2019/0317146 A1  Oct. 17, 2019

(51) Int. Cl.
*G01R 31/311* (2006.01)
*G01R 31/3177* (2006.01)
*G01R 31/317* (2006.01)

(52) U.S. Cl.
CPC ........ *G01R 31/311* (2013.01); *G01R 31/3177* (2013.01); *G01R 31/31725* (2013.01)

(58) Field of Classification Search
None
See application file for complete search history.

(56) References Cited

U.S. PATENT DOCUMENTS

| | | | |
|---|---|---|---|
| 3,757,943 A * | 9/1973 | Chae | A61J 3/074 209/551 |
| 4,631,713 A * | 12/1986 | Romeas | G11B 7/0045 369/111 |
| 5,140,989 A | 8/1992 | Lewis et al. | |
| 5,982,789 A | 11/1999 | Marshall et al. | |
| 6,712,480 B1 | 3/2004 | Leung et al. | |
| 6,767,751 B2 | 7/2004 | Hunter | |
| 6,782,205 B2 | 8/2004 | Trisnadi et al. | |
| 6,785,001 B2 | 8/2004 | Almarzouk et al. | |
| 6,800,238 B1 | 10/2004 | Miller | |
| 6,801,354 B1 | 10/2004 | Payne et al. | |
| 6,813,059 B2 | 11/2004 | Hunter et al. | |
| 6,829,077 B1 | 12/2004 | Maheshwari | |
| 6,839,479 B2 | 1/2005 | Berger et al. | |
| 6,872,984 B1 | 3/2005 | Leung | |
| 6,908,201 B2 | 6/2005 | Gudeman et al. | |

(Continued)

FOREIGN PATENT DOCUMENTS

| | | |
|---|---|---|
| CA | 2676737 A1 | 12/2010 |
| CN | 101557071 | 5/2009 |

(Continued)

OTHER PUBLICATIONS

Bodoh, D., "Improving the DLS Workflow", ISTFA 2012.

(Continued)

*Primary Examiner* — Phung M Chung
(74) *Attorney, Agent, or Firm* — David G. Dolezal

(57) ABSTRACT

Digital testing is performed on an integrated circuit while radiation upsets are induced at locations of the integrated circuit. For each digital test, a determination is made as to whether there is a variation in the output of the digital test from an expected output of the digital test. If there is variation, a time of the variation is indicated. In one example, a location of a defect in the digital circuit can be determined from the times of the variations. In other embodiments, a mapping of the digital circuit can be made from the times.

16 Claims, 7 Drawing Sheets

(56) References Cited

U.S. PATENT DOCUMENTS

| | | |
|---|---|---|
| 6,922,272 B1 | 7/2005 | De Groot et al. |
| 6,922,273 B1 | 7/2005 | Maheshwari et al. |
| 6,927,891 B1 | 8/2005 | Maheshwari |
| 6,928,207 B1 | 8/2005 | Trisnadi et al. |
| 6,934,070 B1 | 8/2005 | Maheshwari et al. |
| 6,947,613 B1 | 9/2005 | Roxlo |
| 6,956,995 B1 | 10/2005 | Shafaat et al. |
| 6,967,491 B2 | 11/2005 | Perdu et al. |
| 6,987,600 B1 | 1/2006 | Maheshwari |
| 7,027,202 B1 | 4/2006 | Hunter et al. |
| 7,042,611 B1 | 5/2006 | Gudeman et al. |
| 7,046,420 B1 | 5/2006 | Hunter et al. |
| 7,049,164 B2 | 5/2006 | Bruner |
| 7,054,515 B1 | 5/2006 | Trisnadi et al. |
| 7,057,795 B2 | 6/2006 | Hunter et al. |
| 7,057,819 B1 | 6/2006 | Maheshwari |
| 7,068,372 B1 | 6/2006 | Trisnadi et al. |
| 7,167,620 B2 | 1/2007 | Handelman |
| 7,177,081 B2 | 2/2007 | Tomita et al. |
| 7,286,764 B1 | 10/2007 | Trisnadi et al. |
| 7,391,973 B1 | 6/2008 | Corrigan et al. |
| 7,394,476 B2 | 7/2008 | Cordingley et al. |
| 7,474,827 B2 | 1/2009 | Handelman |
| 7,673,202 B2 * | 3/2010 | Chung ............ G01R 31/31816 714/726 |
| 7,805,049 B2 | 9/2010 | Handelman |
| 7,838,794 B2 | 11/2010 | Gu et al. |
| 7,872,489 B2 * | 1/2011 | Dickson ............... G01R 31/311 324/758.02 |
| 7,884,633 B2 | 2/2011 | Potok et al. |
| 7,973,545 B2 | 7/2011 | Erington et al. |
| 8,019,585 B2 | 9/2011 | Rahman et al. |
| 8,582,614 B2 | 11/2013 | Meier et al. |
| 8,860,447 B2 | 10/2014 | Vedagarbha et al. |
| 9,148,710 B2 | 9/2015 | Archambault et al. |
| 9,201,096 B2 | 12/2015 | Vedagarbha et al. |
| 9,570,880 B2 | 2/2017 | Fermann et al. |
| 9,595,802 B2 | 3/2017 | Fermann et al. |
| 9,667,317 B2 | 5/2017 | Gross et al. |
| 9,671,456 B2 | 6/2017 | Weizman et al. |
| 9,674,560 B1 | 6/2017 | Harvey et al. |
| 9,674,711 B2 | 6/2017 | Bennett et al. |
| 9,685,992 B2 | 6/2017 | Bennett et al. |
| 9,729,197 B2 | 6/2017 | Gross et al. |
| 9,705,561 B2 | 7/2017 | Henry et al. |
| 9,705,610 B2 | 7/2017 | Barzegar et al. |
| 9,722,318 B2 | 8/2017 | Adriazola et al. |
| 9,735,833 B2 | 8/2017 | Gross et al. |
| 9,739,831 B2 | 8/2017 | Goh et al. |
| 9,742,462 B2 | 8/2017 | Bennett et al. |
| 9,742,521 B2 | 8/2017 | Henry et al. |
| 9,748,626 B2 | 8/2017 | Henry et al. |
| 9,749,053 B2 | 8/2017 | Henry et al. |
| 9,749,083 B2 | 8/2017 | Henry et al. |
| 9,768,833 B2 | 9/2017 | Fuchs et al. |
| 9,769,020 B2 | 9/2017 | Henry et al. |
| 9,769,128 B2 | 9/2017 | Gross et al. |
| 9,780,834 B2 | 10/2017 | Henry et al. |
| 9,787,412 B2 | 10/2017 | Henry et al. |
| 9,793,951 B2 | 10/2017 | Henry et al. |
| 9,793,954 B2 | 10/2017 | Bennett et al. |
| 9,793,955 B2 | 10/2017 | Henry et al. |
| 9,800,327 B2 | 10/2017 | Gerszberg et al. |
| 9,806,818 B2 | 10/2017 | Henry et al. |
| 9,855,099 B2 | 1/2018 | Wu et al. |
| 2003/0099018 A1 | 5/2003 | Singh et al. |
| 2004/0134894 A1 | 7/2004 | Gu et al. |
| 2004/0134896 A1 | 7/2004 | Gu et al. |
| 2006/0192845 A1 | 8/2006 | Cordingley et al. |
| 2007/0002328 A1 | 1/2007 | Woods et al. |
| 2007/0199927 A1 | 8/2007 | Gu et al. |
| 2012/0320450 A1 | 12/2012 | Starodoumov et al. |
| 2014/0077971 A1 | 3/2014 | Archambault et al. |
| 2014/0285227 A1 | 9/2014 | Serrels et al. |
| 2016/0276184 A1 | 9/2016 | Wang |
| 2016/0278196 A1 | 9/2016 | Beijsens et al. |

FOREIGN PATENT DOCUMENTS

| | | |
|---|---|---|
| CN | 203504761 | 3/2014 |
| DE | 19622184 A1 | 12/1997 |
| DE | 19919584 A1 | 11/2000 |
| DE | 19925960 A1 | 1/2001 |
| IN | 202924 | 2/2007 |
| JP | 2015006650 A | 1/2015 |
| WO | 2003032549 A2 | 4/2003 |
| WO | 2006114557 A1 | 11/2006 |
| WO | 2007092803 A2 | 8/2007 |
| WO | 2008074941 A2 | 6/2008 |
| WO | 2011163353 A2 | 12/2011 |
| WO | 2013188046 A1 | 12/2013 |
| WO | 2015061411 A1 | 4/2015 |

OTHER PUBLICATIONS

Bodoh, D., "Root Cause Analysis Techniques Using Picosecond Time Resolved LADA", ISTFA 2014.

Buchner, S., "Pulsed-Laser Testing Methodology for Single Event Transients in Linear Devices", IEEE Transactions on Nuclear Science, vol. 51, No. 6, Dec. 2004.

Douin, A., "influence of Laser Pulse Duration in Single Event Upset Testing", IEEE Transactions on Nuclear Science, vol. 53, No. 4, Aug. 2006.

Erington, K., "Measuring Propagation Delays of Critical Paths Using Time-Resolved LADA", IEEE 2014.

Kasapi, S., "Advanced Scan Chain Failure Analysis Using Laser Modulation Mapping and Continuous Wave Probing", ISTFA Exchange Paper 2011.

Lewis, D., "Backside Laser Testing of ICs for SET Sensitivity Evaluation", IEEE Transactions on Nuclear Science, vol. 48, No. 6, Dec. 2001.

Liao, J. Scan chain failure analysis using laser voltage imaging:, Microelectronics Reliability, vol. 50, Issues 9-11, pp. 1422-1426, 2010.

Melinger, J.S., "Critical Evaluation of the Pulsed Laser Method for Single Event Effects Testing and Fundamental Studies", IEEE Transactions on Nuclear Science, vol. 41, No. 6, Dec. 1994.

Moss, S., "Correlation of Picosecond Laser-Induced Latchup and Energetic Particle-Induced Latchup in CMOS Test Structures", IEEE Transactions on Nuclear Science, vol. 42, No. 6, Dec. 1995.

Ng, Y., "Laser Voltage Imaging: A new Perspective of Laser Voltage Probing", ISTFA 2010.

Parrassin, T., "Laser Voltage and its derivatives, efficient techniques to address defect on 28nm technology", ISTFA 2013 Conference Proceedings from the 39th International Symposium for Testing and Failure Analysis, Nov. 3-7, 2013.

Safran, L., "Advanced Fault Localization through the use of Tester Based Diagnostics with LVI, LVP, CPA and PEM", ISTFA 2013 Conference Proceedings from the 39th International Symposium for Testing and Failure Analysis, Nov. 3-7, 2013.

Serrels, K.A., "Two Photon-Absorption-Enhanced Laser-Assisted Device Alteration and Single-Event Upsets in 28NM Silicon Integrated Circuits", ISTFA 2013.

Serrels, K.A., "Two-photon laser-assisted device alteration in silicon integrated-circuits", Optics Express, vol. 21, No. 24, Dec. 2, 2013.

Serrels, K.A., "Scan Chain Fault Isolation using Single Event Upsets Induced by a Picosecond 1064NM Laser", International Symposium for Testing and Failure Analysis, 2018.

Goh, S.H., "Fault Isolation using Electrically-enhanced LADA (EeLADA)", IEEE 2015.

Moukhtari, I., "Analysis of Short-Term NBTI Effect on the Single-Event Upset Sensitivity of a 65nm SRAM using Two-Photon Absorption", Proc. RADECS 2013 e-1 1/6, IEEE 2013.

Yeh, D., "Synchronous-asynchronous laser mode-locking transition: experimental results", Optical Society of America 2016.

(56) References Cited

OTHER PUBLICATIONS

Notice of Allowance dated May 2, 2019 in U.S. Appl. No. 15/908,374.
Dickson, K., "Picosecond Time-Resolved LADA Integrated with a Solid Immersion Lens on a Laser Scanning Microscope", ISTFA 2017.
Kiyan, T., "Timing Sensitivity Analysis of Logical Nodes in Scan Design Integrated Circuits by Pulsed Diode Laser Stimulation", Proceedings from the 34th International Symposium for Testing and Failure Analysis, Nov. 2-6, 2008.
Mattey, G., "Time Resolved LADA using a modulated pulsed laser to fault isolate bridging defects and framing high accuracy Physical FA plan in 14nm FinFET technologies", Proceedings from the 43rd International Symposium for Testing and Failure Analysis, Nov. 5-9, 2017.

* cited by examiner

DIGITAL TESTS WITH RADIATION INDUCED UPSETS

BACKGROUND OF THE INVENTION

Field of the Invention

This invention relates in general to digital tests with radiation induced upsets.

Description of the Related Art

Laser beams can be used to induce upsets on integrated circuits during digital testing.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As described herein, digital testing is performed on an integrated circuit while radiation upsets are induced at locations of the integrated circuit. For each digital test, a determination is made as to whether there is a variation in the output of the digital test from an expected output of the digital test. If there is variation, a time of the variation is indicated. In one example, a location of a defect in the digital circuit can be determined from the times of the variations. In other embodiments, a mapping of the digital circuit can be made from the times.

Providing techniques for utilizing the times of variations due to radiation induced upsets during digital tests may provide for a way to identify more efficiently the locations of defects in an integrated circuit. In other embodiments, it may also provide a more efficient way to physically map a signal path of a digital circuit of an integrated circuit such as a scan order of a scan chain. Such a mapping may be made without having access to layouts of the integrated circuit being tested. Such a feature may be especially useful with third party foundries so that defect detection can be performed where integrated circuit layout information is not available.

Figure 1:
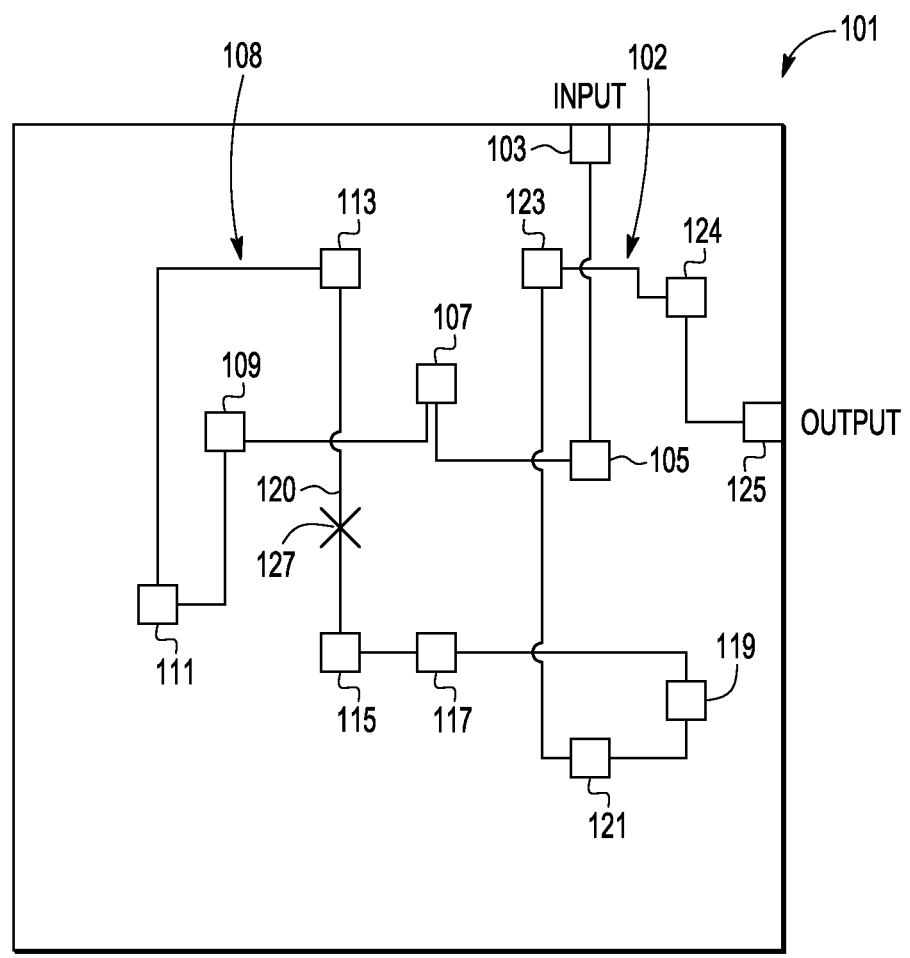
FIG. 1 is a top view of an integrated circuit showing a digital circuit according to one embodiment of the present invention.

FIG. 1 is a top view of an integrated circuit 101 showing a scan chain 102 located on the integrated circuit. A scan chain is a digital circuit that maybe formed by linking a number of latches together with coupling links to provide a path for data through an integrated circuit. In the embodiment shown, scan chain 102 includes latches 105, 107, 109, 111, 113, 115, 117, 119, 121, 123, and 124. The latches are linked together in a scan chain by coupling links (e.g. 108). In one embodiment, a coupling link (108) includes one or more conductive lines providing a data path for a scan bit between the latches. In other embodiments, a coupling link may include other devices such as buffers or logic gates (e.g. inverters). The latches are coupled together with the coupling links in a scan chain to perform scan chain testing on the integrated circuit during testing operations. Although not shown, the latches maybe coupled to other functional circuitry (e.g. logic gates, buffers (not shown)) of the integrated circuit 101 for performing operations during the operation of the integrated circuit. In some embodiments, the latches may include multiplexers (not shown) that when selected for scan testing, enable the scan chain by providing a scan bit from a preceding latch in the scan chain order via a coupling link to a subsequent latch in the scan chain order. When the integrated circuit is in an operational mode, the input multiplexer provides an output of the functional circuitry (not shown) to the latch for latching a data state during an operation of the integrated circuit. The latches may be flip flops such as D, J-K, master-slave, other types of flip flops, or other types of latches, depending upon the circuitry being implemented.

In some embodiments, scan chain testing is a type of digital testing that involves placing the integrated circuit 101 in a scan chain test mode, inputting data bits into an input 103 of integrated circuit 101, clocking the data bits through the scan chain 102, and comparing the outputted data bits from an output 125 with an expected result. In some embodiments, a scan chain test can be used to tell if the latches or the coupling links of an integrated circuit are defective.

Scan chain testing is typically performed by the manufacturer after singulation of the wafer and prior to packaging. However, in other embodiments, scan chain testing can be performed prior to singulation of the wafer or after packaging of the integrated circuit. It may also be performed by other entities including during a diagnostic mode after the integrated circuit has been implemented in a system.

In the embodiment shown, chain 102 has a defect 127 in link 120. Accordingly, there will be a variation of the actual output result of a scan chain test from the expected result for the scan chain test. In some examples, a defect may be caused by a short in the interconnect layers or in the gate dielectric of a device of the latch or in the coupling links. In other cases, the defect may be in the clock circuits, control circuits, or an interconnect for the scan chain. Defects may also include shorts between conductors, open conductors, faulty transistor characteristics, or defects induced due to particles or errors in manufacturing.

Integrated circuit 101 may include numerous additional scan chains that may be tested during a testing operation of integrated circuit 101. Integrated circuit 101 may be any one of a number of integrated circuit types such as a processor, microcontroller, memory, sensor, ASIC, controller, etc.

Figure 2:
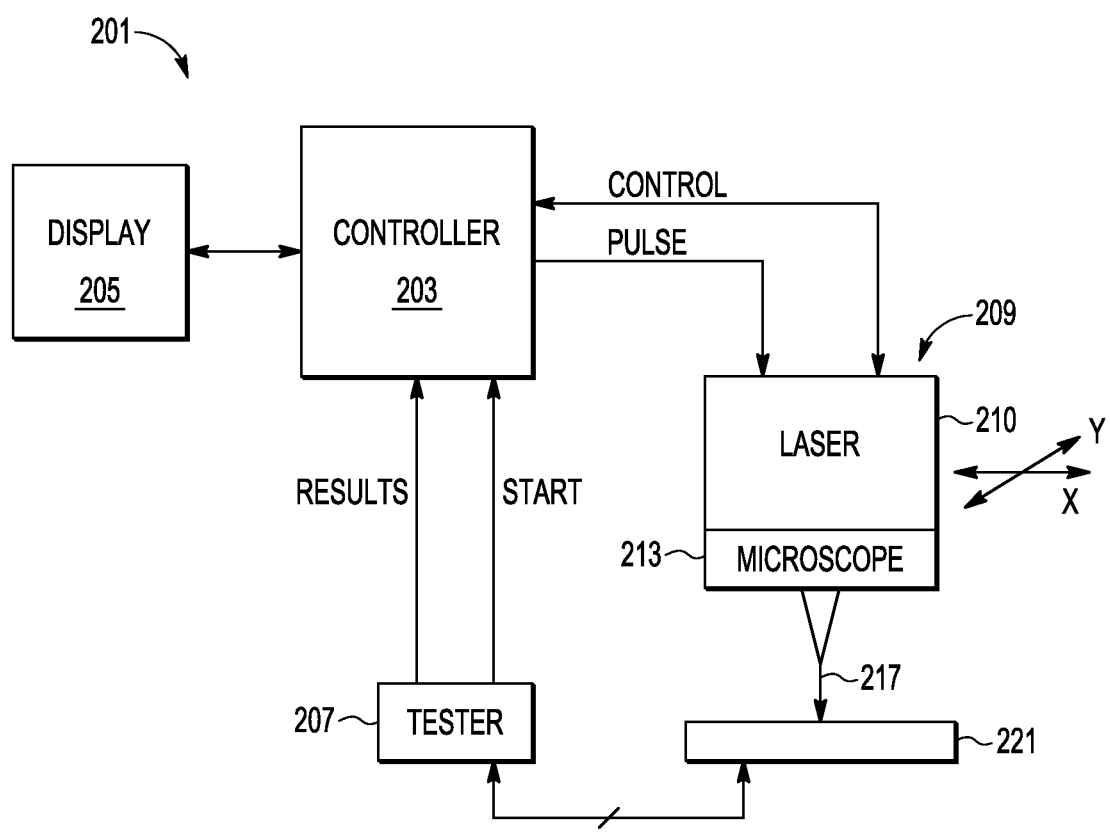
FIG. 2 is a block diagram of a test system according to one embodiment of the present invention.

FIG. 2 is a block diagram of a test system for performing digital testing according to one embodiment. In the embodiment shown, system 201 includes a controller 203, a tester 207, a laser system 209, and display 205. Laser system 209 includes a laser generator 210 for generating a laser beam 217 and a microscope 213 that is used to focus the laser beam 217 on a specific location of an integrated circuit 221 being tested. In one embodiment, the laser beam 217 is focusable on different locations on the integrated circuit in an X-Y plane of a major surface of an integrated circuit.

Laser generator 210 can generate a laser beam at a setting that is capable of upsetting a logic state of a digital circuit of an integrated circuit (221). A logic state of a digital circuit is upset when a logic state of a latch is changed due to the laser beam striking a location of an integrated circuit. In some examples, a laser beam can upset a logic state in a scan chain by injecting electron-hole pairs in the p-n junctions, creating current leakage, or by locally heating the device to affect circuit characteristics.

In some embodiments, the beam strikes circuitry of the latch to flip the logic states to vary the output. In other embodiments, a beam can strike other locations of the integrated circuit that result in a variation in the output. In some embodiments for scan chain testing, these other locations these can be removed from consideration if they are not consistent with mapping the sequence.

In general, more laser power will increase the number of nodes in an integration circuit that can be upset. In practice, eventually as power is turned up in a pulsed laser system, there will be a damage threshold where physical damage to the integrated circuit occurs. In some embodiments, some nodes with strong transistors driving them cannot be upset before reaching the damage threshold. In some embodiments, smaller transistors are easier to upset than larger ones. Some state machine storage circuits typically have small feedback transistors that can be upset easily due to the storage feedback where the stored value can be changed. Additionally, transient logic disturbances feeding a latch can also change the stored value of the latch.

In one embodiment for an integrated circuit with a silicon substrate and a 40 nm critical dimension, a laser beam in a wavelength range of 1064 nm, at an energy of 10 nanojoules, and for a duration of 25 picoseconds can be used to upset a logic state of a scan chain of the integrated circuit. Other laser settings may be used in other embodiments.

During testing operations, tester 207 is electrically coupled to the power supply terminals and I/O terminals of integrated circuit 221 to send and receive signals in performing tests on the integrated circuit including performing scan chain tests. In addition to scan chain tests, tester 207 may perform other tests on the integrated circuit including other digital tests. In some embodiments, tester 207 includes a controller (not shown), memory (not shown), and interface for providing and receiving data (not shown) with other components of a test system.

In one embodiment, tester 207 is a DIAMOND-10 tester made by XCERRA. Laser system 209 is a KATANA LASER made by NKT PHOTONICS. In one embodiment, controller 203 and display 205 are components of a PHEMOS 1000 system from HAMAMATSU, with delay generators made by STANFORD RESEARCH SYSTEMS. However, other components may be used in other embodiments.

In some embodiments, how the components of system 201 operate together in performing digital testing with laser induced upsets depends upon the capabilities of each component. For example, in one embodiment, tester 207 signals controller 203 to control when and where the pulse is to be provided to a location of integrated circuit 221. In other embodiments, controller 203 would control tester 207 as to when to provide the test signals. In one embodiment, tester 207 compares the output data of a digital test with the respected results and provides an indication of whether there was a variation in the test results and the timing of the variation to controller 203. In other embodiments, tester 207 provides the output data and timing information to controller 203 wherein controller 203 performs the comparison to determine if there was a variation and determines the time of the variation (e.g. the difference in time between the radiation beam pulse (or start of radiation beam) and the time of observed variation at an output). In some embodiments, controller is integrated with laser system 209.

In some embodiments, each of the components of system 201 are sold by different companies where interface mechanisms are programmed or installed in the component post sale to enable the system to perform digital testing with laser induced upsets. In other embodiments, the system maybe designed and sold by one manufacturer where the system is integrated to operate together. In such a system, one controller may control the operations of the other components of the system. The system may have other configurations, other components, and/or operate in different manners in other embodiments. For example, in other embodiments, tester 207 may be coupled to display 205 to provide the information to be displayed.

Figure 3:
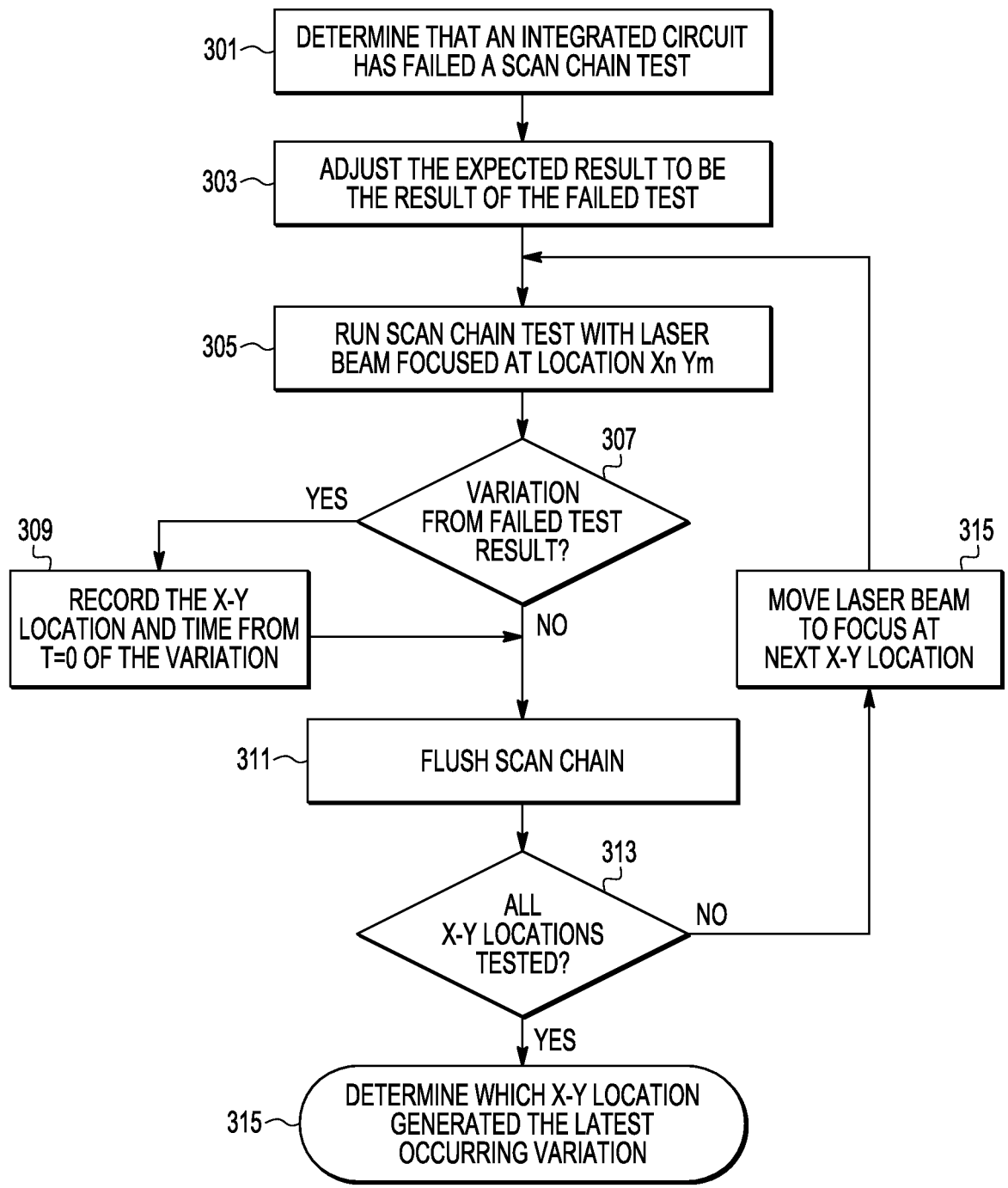
FIG. 3 is a flow diagram of a digital testing operation according to one embodiment of the present invention.

FIG. 3 sets forth a flow chart for performing scan chain testing with laser induced upsets to determine a location of a defect in a scan chain of an integrated circuit according to one embodiment. In operation 301, a determination is made that an integrated circuit (221) has failed an initial scan chain test. In one embodiment, a tester (207) performs the scan chain test on a scan chain of the integrated circuit and compares the output of the scan chain test with an expected result to determine if the scan chain of the integrated circuit failed or passed the initial scan chain test. The initial scan chain test does not involve performing a laser induced upset on the integrated circuit. In one embodiment, if the scan chain passes the initial scan chain test, then the subsequent operations shown in FIG. 3 are not performed in that there is no defect in the scan chain.

If the integrated circuit is determined to fail the initial scan chain test, the flow proceeds to operation 303 where the expected result of the scan chain test is replaced with the scan chain output of the failed initial scan chain test.

In operation 305, the test system performs a scan chain test on the integrated circuit with a laser beam focused at a first X-Y location. In an embodiment of FIG. 2, a scan chain test is initiated by tester 207. Tester 207 is electrically coupled to the power supply terminals, clocking terminals, and I/O terminals of integrated circuit 221 to provide and receive signals with integrated circuit 221. Tester 207 initializes the integrated circuit for a scan chain test including initializing the power supply voltages and loads the input scan test data into the scan chain. After the input scan test data is loaded into the scan chain, tester 207 then signals controller 203 to initiate a laser pulse at a the designated X-Y location of the integrated circuit. Controller 203 then signals laser generator 210 to move the laser beam to the desired location and to provide a laser pulse for a desired amount of time. When the pulse is provided (at T=0), tester 207 clocks the scan chain and receives the data bits outputted by the scan chain. In one embodiment, the laser beam is provided for only one clock pulse at the location. In other embodiments, the laser is continuously provided until the end of the scan chain test.

If the laser is focused at a location of a latch in the scan chain, the laser beam will cause the latch to change data states. If the upset occurs subsequent to the defect in the scan chain, the changed data state will prorogate through the chain and will be reflected as a variation (as determined in operation 307) in the scan chain output with the result of the initial scan chain test that failed. If there is a variation in the operation, then the time of the occurrence of the variation in the scan chain output with respect to T=0 is recorded for the X-Y location in operation 309. In one embodiment, the time is recorded in fractional seconds. In other embodiments, time may be recorded as a number of clock cycles of a clock signal used to clock the data through the scan chain. In some embodiments, the clock signal may have a variable clock cycle for the scan chain test where the "time" is not necessary an indication of the actual time but an indication of the number of clock cycles of the scan chain test.

If the laser is focused on a location of the integrated circuit where there is no latch or focused on a latch that precedes the defect in the scan chain order, then there will be no variation in the scan chain output.

After the scan chain test, tester 207 flushes the output of the scan chain in operation 311 so that all effects of the laser induced upset are removed from the scan chain. In one embodiment, the scan chain is flushed by clocking the scan chain by the number of latches of the scan chain.

At operation 313, a determination is made whether a scan chain test has been run for a laser beam focused at each X-Y location. If not, a laser beam is focused on the next X-Y location to be tested and a scan chain test is run for that location, wherein operations 305, 307, 309, 311, and 313 are performed again.

In the embodiment shown, after scan chain tests have been run for all X-Y locations of the integrated circuit, a determination is made as to which X-Y location generated the latest occurring variation in its scan chain output from the expected output in operation 315.

Figure 4:
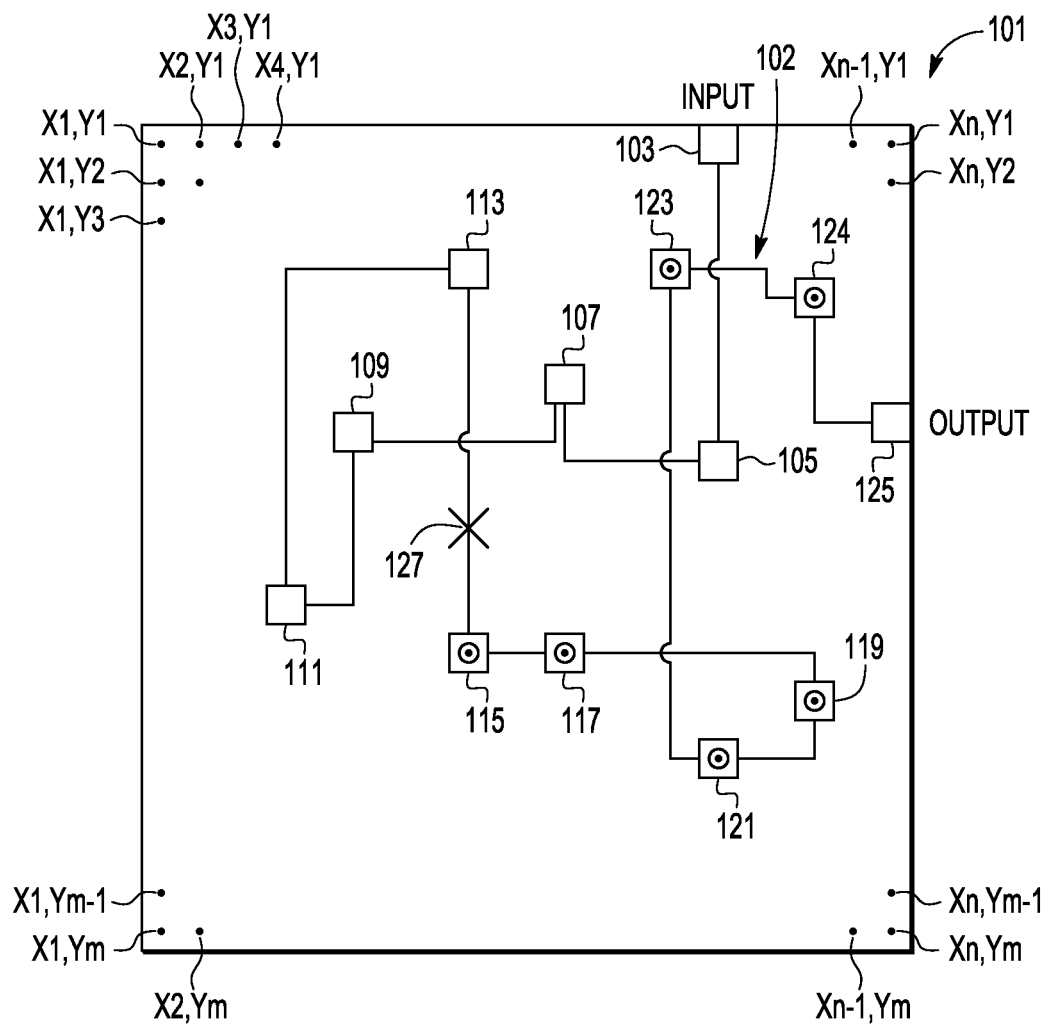
FIG. 4 is a top view of an integrated circuit showing a found defect in a digital circuit according to one embodiment of the present invention.

FIG. 4 shows a top view of an integrated circuit 101 illustrating how a scan chain test as described with respect to FIG. 3 can be used to locate the first latch subsequent to a defect 127 in a scan chain.

FIG. 4 shows X-Y locations ($X_{1-n}$, $Y_{1-m}$) located at the corners of integrated circuit 101 where a laser beam is focused for one scan chain test. Although FIG. 4 shows some of the X-Y locations, the method of FIG. 3 performs a scan chain test with a laser induced upset for each X-Y location including those not specifically shown in FIG. 4. In one embodiment, the X-Y locations are evenly spaced across integrated circuit 101 from each other in both the X and Y directions. In one embodiment, the X-Y location spacing is approximately 100 nanometers based on the size of the microscope field of view of 50 microns square, divided into a square grid with 512 locations in X and 512 locations in Y. In other embodiments, the X-Y locations may be non-uniformly spaced across the integrated circuit. In other embodiments, the X-Y locations may be located in a specific area of the integrated circuit where the scan chain is known to reside.

The focus locations of a laser beam where a scan chain test generated a variation in a scan chain output are shown in FIG. 4. Each of these locations is at a location of a latch of the scan chain that is subsequent in the scan chain order to a defect 127 in the scan chain. The X-Y locations that do not have a latch in the scan chain order subsequent to the defect 127 do not generate a variation during their scan chain tests.

In one embodiment, the location of a latch in a scan chain order can be determined from the time of occurrence of a variation in the scan chain output of the scan chain test for that location. For example, because latch 114 is the last latch in the scan chain, a laser generated upset at the latch will produce a variation at the first data output bit of a scan chain test. The scan chain test for that location will produce the variation occurring at the earliest time of all the scan chain tests producing a variation. A laser upset at the location of latch 123 will generate a variation in the second output bit that is outputted. The scan chain test for that location will produce the variation occurring at the second earliest time of all the scan chain tests producing a variation.

Because latch 115 is located closest to the defect 127, the scan test for that location will produce the variation occurring at the latest time of all the scan tests producing a variation. For scan chain 102, a laser beam focused on latches 111, 109, or 113 preceding a defect 127 will not generate a variation at output 125 because defect 127 will flip the changed state back to the defective state.

In one embodiment, the area of the defect can be more quickly found by tracing the scan chain from the last good latch (115) back via coupling link 120 to the first latch 113 preceding the defect 127. In some embodiments, latch 113 may be defective. In one embodiment, the location of coupling link 120 and latch 113 can be found from schematics of the integrated circuit. In another embodiment, operations described with respect to FIG. 8 below can be performed on a corresponding scan chain of an integrated circuit of the same design that passed the initial scan chain test to determine the location of latch 113 (and the location of all other latches of the scan chain order preceding the defect).

Figure 5:
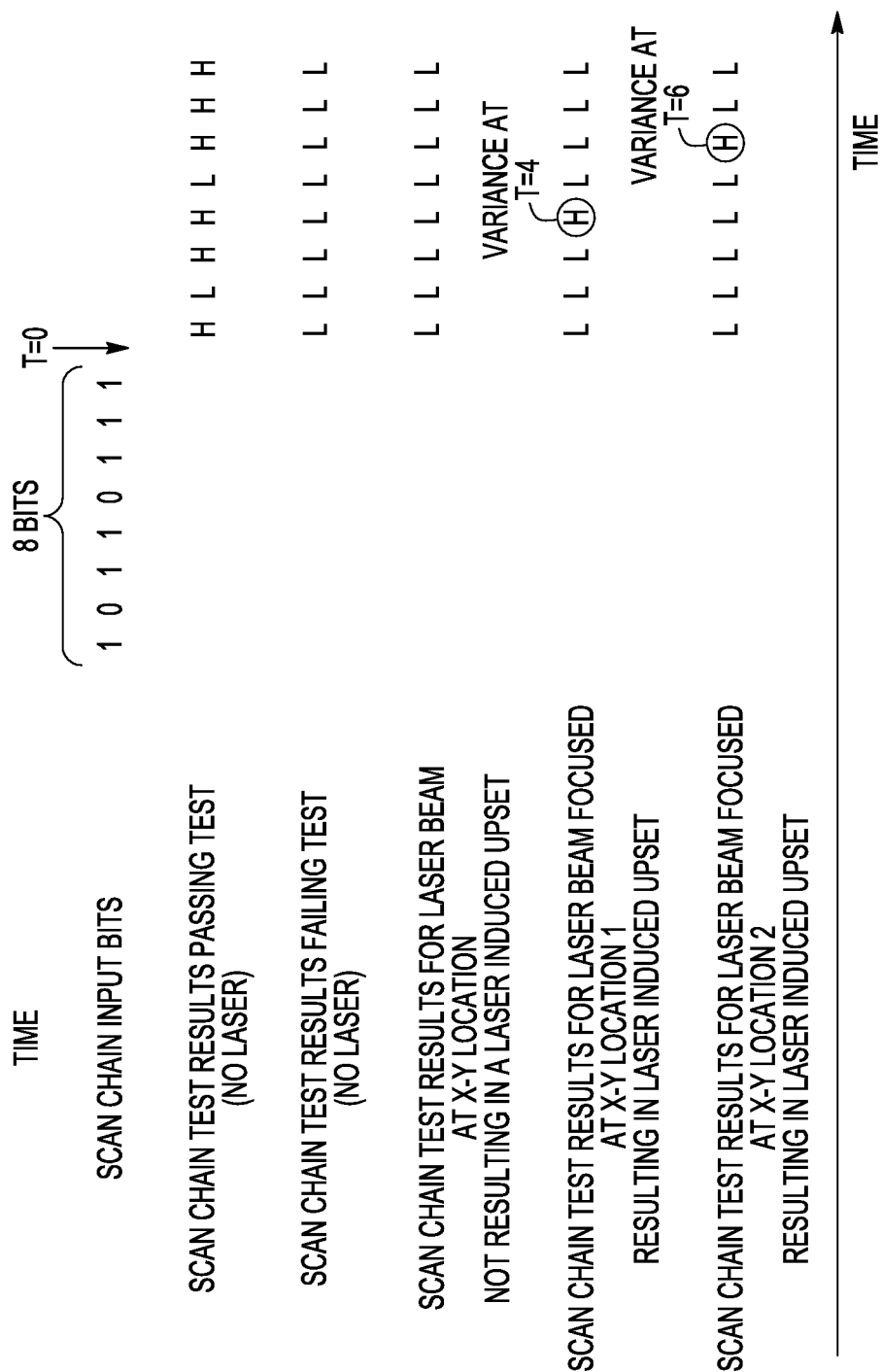
FIG. 5 shows a timeline of digital test results according to one embodiment of the present invention.

FIG. 5 shows an example of a time line of scan chain input bits ("1s" and "0s") and the output results of various scan chain tests. The output results are shown as high logic levels (H) and low logic levels (L). In the embodiment shown, the scan chain being tested has 8 latches.

For a scan chain test, the 8 input data bits are inputted serially in a scan chain at an input (e.g. input 103) and are latched at each subsequent clock cycle. In the timeline, the left most "1" of the input bits represents the first bit inputted into the scan chain. After 8 clock cycles, all the input bits are loaded into the scan chain. The output (125) is then measured during the next 8 clock cycles to determine whether a high value or low value occurs at the scan chain output as the data bits are clocked out of the scan chain.

The output result of the scan chain is then compared with an expected result of the scan chain. If there is no defect in the scan chain, the results will match and the scan chain will pass the test. If there is a defect, then there will be a variation with at least one bit position between the scan test output result and the expected result. In some embodiments, the scan chain output and the expected result are compared bit by bit as the output data is clocked out of the scan chain.

In the embodiment shown, the expected result of a scan test with no laser induced upset is where the output bits match the input bits (where a "1" corresponds to an "H"). However, in other embodiments, the expected output would be where a "1" corresponds to an "L". In some embodiments, the sequence of a 1s and 0s of the input may not produce same sequence of H's and L's in an expected result depending upon the operations performed on the scan chain data by the scan chain.

FIG. 5 also shows an example of a scan chain output result for a scan chain that fails the scan chain test and there was no laser beam applied during the test. With the embodiment shown, the scan chain has a defect that causes the scan chain to output low voltage values (L) regardless of the data being inputted into the scan chain. Such a result may be due to a short in the scan chain. However, a failing scan chain test may exhibit other patterns in other embodiments (e.g. all H's, alternating H's and L's), depending upon the scan chain configuration and/or the type of defect.

FIG. 5 shows the results of three scan chain tests with a laser beam focused at an X-Y location at a time T=0 of the test. The test for a laser beam focused at an X-Y location that does not generate a laser induced upset generates a matching result with the output result of a failing test (all "L"s).

The bottom two results are for scan tests with a laser beam focused at X-Y locations that generate upsets in the scan chain that cause a variation in the scan chain output from the output of a failing test (all L's). The test with the laser beam focused at location 1 generates a variation (H) at the fourth output bit. Accordingly, the laser beam was focused on the fourth to last latch of the scan chain. The test with the laser beam focused X-Y location 2 generates a variation at the sixth output bit. Accordingly, the laser beam was focused on the 6th to last latch of the scan chain during that test. Thus, from the time of the occurrence of a variation of a scan chain test, the scan chain order of the latch can be determined.

Figure 6:
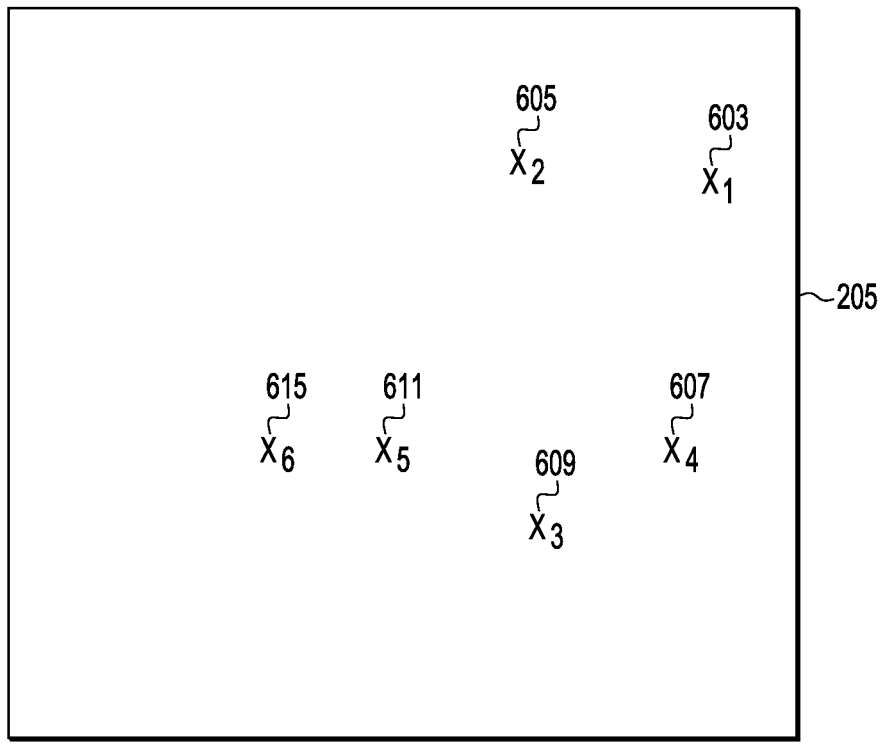
FIG. 6 is a view of a display according to one embodiment of the present invention.

FIG. 6 is a view of a display 205 used to display results of the operations of FIG. 3 performed on scan chain 102 of integrated circuit 101. In the embodiment shown, display 205 shows an "X" at every location that corresponds to an X-Y location on integrated circuit 101 where a laser beam induced upset generated a variation in a scan chain test output result. X 603 corresponds to the location of latch 124. X 605 corresponds to the location of latch 123. X 609 corresponds to latch 121. The X 607 corresponds to latch 119. X 611 corresponds to the location of latch 117. X 615 corresponds to the location of latch 115. In other embodiments, other types of symbols may be used to indicate the location of a latch (e.g. a square, circle, dot, flipflop symbol).

In the embodiment of FIG. 6, each "X" has an associated number to indicate the position in a scan chain order from the output or to indicate the clock cycle where the variation occurred in the output. X 603 has a 1 indicating that it is the closest latch to the output in the scan chain order or that its variation occurred first. Flop 615 includes a 6 indicating that it is the furthest latch from the output in the scan chain order or that its variation occurred in the 6th clock cycle. In other embodiments, the number may indicate the position in the scan chain order from the defect 127 of the scan chain. For example, X 615 would include a "1" since it is the closest to the defect. In still other embodiments, each symbol would include the fractional seconds in which the variation occurred at the output.

In other embodiments, a display may provide other visual indications of position in the scan chain order, positions with respect to a defect, or time of variation information. In one embodiment, a display may display the position or time information in grayscale where each shade represents a different position or a different amount of time. With such an embodiment, X 615 would appear the darkest in that it is the closest to the defect. In other embodiments where the display is a color display, each latch symbol would be displayed at a different color to indicate a different time or scan chain order. In one example, X 615 would be red indicating that it is closer to the defect.

In other embodiments, each pixel of display 601 would correspond to an X-Y location of an integrated circuit. Those locations that generate a variation would be gray shaded at a shading level indicative of the time of the variation. Those locations that did not generate a variation would be either black (or white). In other embodiments, the pixels corresponding to locations that generated a variation would be a non-black (or nonwhite) color.

In one embodiment, tester 207 may provide an analog value to a display 205 based on the variation time. Display 205 would convert the analog voltage to the appropriate shade of gray (or color) for a pixel to indicate variation time.

Other embodiments would include link symbols illustrating the connection between the latches in the scan chain. In still other embodiments, a circuit representation of the entire scan chain may be displayed where either the latches that generated variations would be highlighted (latches subsequent to the defect) or the latches that did not generate variations (latches preceding the defect) would be highlighted. In one embodiment, the representation of the entire scan chain would be generated from layout schematics of the integrated circuit. In other embodiments, the representation of the scan chain would be generated from performing the operations set forth in FIG. 8 on a passing scan chain of another integrated circuit of the same design. In still other embodiments, display 601 may display a spread sheet of the latches with a grid coordinate, latch order number, and/or variation time for each latch.

Figure 7:
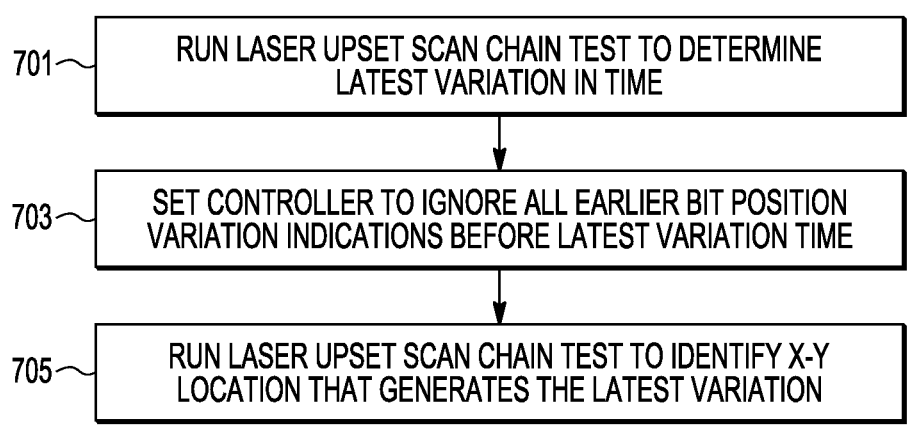
FIG. 7 is a is a flow diagram of a digital testing operation according to one embodiment of the present invention.

FIG. 7 sets forth operations to determine the X-Y laser beam location that generates the latest failure time according to another embodiment of the present invention. These operations may be utilized for a test system that cannot provide variation times with the associated X-Y coordinate information of the laser for the test that generated the variation. In the embodiment of FIG. 7, a laser upset scan test is ran with a laser focused on each X-Y location. After all the tests are run, a tester indicates a latest variation time of all the scan tests in operation 701. In operation 703, a controller is set to flag only those tests that generate a variation at the bit output position of the latest variation time. In operation 705, the upset scan tests are rerun wherein only the X-Y laser beam position that generates the latest variation is flagged.

Figure 8:
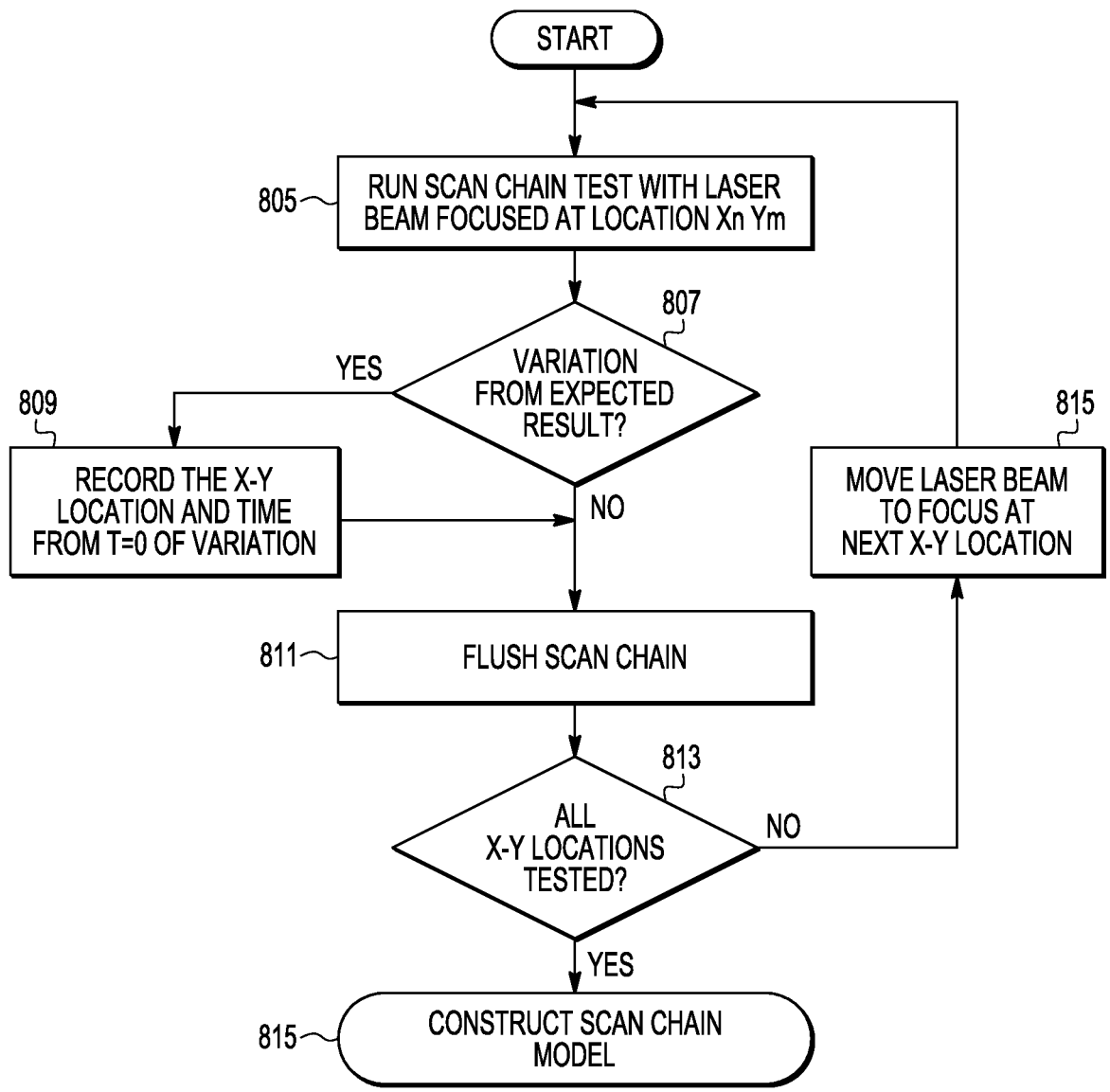
FIG. 8 is a flow diagram of a digital testing operation according to one embodiment of the present invention.

FIG. 8 sets forth a flow chart for performing scan chain testing with laser induced upsets to determine the location of the latches of a scan chain and their scan chain order according to one embodiment. This operation is performed on a scan chain that has passed an initial scan chain test where no laser induced upsets were performed on the scan chain during testing.

In operation 805, the test system performs a scan chain test on the integrated circuit with a laser beam focused at a first X-Y location. If a variation in the output with respect to the expected result occurs as determined in 807, the time of the occurrence of the variation in the scan chain output with respect to T=0 is recorded for the X-Y location in operation 809. If the laser is focused on a location of the integrated circuit where there is no latch, then there will be no variation in the scan chain output.

After the scan chain test, tester 207 flushes the output of the scan chain in operation 811 so that all effects of the laser induced upset are removed from the scan chain. In one embodiment, the scan chain is flushed by clocking the scan chain by the number of latches of the scan chain.

At operation 813, a determination is made whether a scan chain test has been run for a laser beam focused at each X-Y location. If not, a laser beam is focused on the next X-Y location to be tested and a scan chain test is run for that location, wherein operations 805, 807, 809, 811, and 813 are performed again.

In the embodiment shown, after scan chain tests have been run for all X-Y locations of the integrated circuit, a model of the scan chain is constructed in operation 815 where the physical location and logical order of each latch in the scan chain can be determined from the variation times generated.

In some embodiments, an integrated circuit may include multiple scan chains wherein the operations described herein can be performed on each scan chain to determine whether there are defects in the scan chain and the location of the defects of the scan chain or to determine the locations and scan chain order of the latches. Also, although a laser beam is used to induce an upset in scan chain test described above, other types of radiation beams can be used to induce upsets in other scan chain tests.

In the embodiments describe above, radiation induced upsets are performed during scan chain testing on scan chains of an integrated circuit. However, in other embodiments, radiation induced upsets as described herein may be performed during other types of digital tests such as e.g. memory built in self-tests, circuitry functional tests, logic scan tests, and other types of structural tests to determine the location of a defect or the location of devices of a digital circuit. Furthermore, radiation induced upsets maybe performed during digital tests on other types of digital circuits such as e.g. memories, state machines, and self-test circuits to determine defect location and/or device location.

Features shown or described with respect to one embodiment may be implemented with other embodiments shown or described.

One embodiment of a method for performing digital testing includes performing with a test system, a plurality of digital tests on a digital circuit of an integrated circuit where each digital test is performed with a radiation beam focused at a different location of a plurality of locations of the integrated circuit at a specific test time of the digital test. During each digital test of the plurality, the radiation beam is at a setting capable of upsetting a logic state of the digital circuit. The method includes for each digital test of the plurality, determining with the test system, whether there is a variation in a logic state of an output of the digital circuit from an expected failing digital test output of the integrated circuit and if there is a variation, determining a time of an occurrence of the variation with respect to the specific test time.

Another embodiment of a method for performing digital testing includes performing with a test system, a plurality of scan chain tests on a scan chain of an integrated circuit where each scan chain test is performed with a radiation beam focused at different location of a plurality of locations of the integrated circuit at a specific test time of the scan chain test. During each scan chain test of the plurality, the radiation beam is at a setting capable of upsetting a logic state of the scan chain. The method includes for each scan chain test of the plurality, determining with the test system, whether there is a variation in a logic state of an output of the scan chain test from an expected scan chain test output of the integrated circuit and if there is a variation, determining a time of an occurrence of the variation with respect to the specific test time. The scan chain includes plurality of latches in a scan chain order. The method further includes providing an indication of the scan chain order of the plurality of latches of the scan chain from the determining a time.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for performing digital testing, the method comprising:
    performing with a test system, a plurality of digital tests on a digital circuit of an integrated circuit where each digital test is performed with a radiation beam focused at a different location of a plurality of locations of the integrated circuit at a specific test time of the digital test, wherein during each digital test of the plurality, the radiation beam is at a setting capable of upsetting a logic state of the digital circuit;
    for each digital test of the plurality, determining with the test system, whether there is a variation in a logic state of an output of the digital circuit from an expected failing digital test output of the integrated circuit and if there is a variation, determining a time of an occurrence of the variation with respect to the specific test time.

2. The method of claim 1, further comprising:
    providing by the test system an indication of a digital test of the plurality of digital tests providing a latest time of an occurrence of the variation with respect to the specific test time.

3. The method of claim 2 wherein the providing the indication includes indicating a location of the plurality of locations of the focus of the radiation beam of the digital test providing the latest time.

4. The method of claim 3 wherein providing the indication includes displaying on a display the location of the plurality of locations of the focus of the radiation beam of the digital test providing the latest time.

5. The method of claim 1 further comprising:
    for each digital test for which there is a determined variation, providing an indication of the time of the occurrence of the variation and an indication of a location of the plurality of locations of the focus of the radiation beam.

6. The method of claim 5 wherein the providing an indication includes displaying on a display the indication of the location of the plurality of locations of the focus of the radiation beam of the digital test and the indication of the time of the occurrence of the variation.

7. The method of claim 5 wherein the indication of the time of the occurrence of the variation is indicated by a shading level of a plurality of shading levels of gray scale on a display at a location of the display corresponding to the location of the plurality of locations of the focus of the radiation beam of the digital test, wherein the shading levels of the plurality of shading levels each represent an amount of time.

8. The method of claim 5 wherein the indication of the time of the occurrence of the variation is indicated by a color of a plurality of colors on the display at a location of the display corresponding to the location of the plurality of locations of the focus of the radiation beam of the digital test, wherein the colors of the plurality of colors each represent an amount of time.

9. The method of claim 5 wherein the indication of time is indicated as a number of clock cycles from the specific test time.

10. The method of claim 1 further comprising:
for each digital test of the plurality for which there is a determined variation, providing an indication of a location of the plurality of locations of the focus of the radiation beam.

11. The method of claim 1 wherein the digital circuit is characterized as a scan chain and the plurality of digital tests are characterized as a plurality of scan chain tests, wherein the scan chain includes a plurality of latches in a scan chain order, the method further comprising:
providing an indication of a closest subsequent latch of the plurality of latches from a defect in the scan chain order.

12. The method of claim 1 wherein the digital circuit is characterized as a scan chain and the plurality of digital tests are characterized as a plurality of scan chain tests, wherein the scan chain includes plurality of latches in a scan chain order, the method further comprising:
providing an indication of the scan chain order of latches of the plurality of latches subsequent from a defect in the scan chain order from the determining a time of the occurrence of the variation.

13. The method of claim 1 wherein the plurality of locations are uniformly spaced locations from each other on the integrated circuit.

14. The method of claim 1 further comprising:
providing a latest time of occurrence of the variation with the respect to the specific test time of the plurality of digital tests;
performing with the test system, a second plurality of digital tests on the digital circuit of the integrated circuit where each digital test is performed with a radiation beam focused at a different location of the plurality of locations of the integrated circuit at a specific test time of the digital test, wherein during each digital test of the second plurality, the radiation beam is at a setting capable of upsetting a logic state of the digital circuit;
providing an indication of a digital test of the second plurality of digital tests providing a latest time of occurrence of the variation.

15. The method of claim 1 wherein the digital circuit is characterized as a scan chain and the plurality of digital tests are characterized as a plurality of scan chain tests.

16. The method of claim 1, wherein the digital circuit is characterized as a scan chain and the plurality of digital tests are characterized as a plurality of scan chain tests, the method further comprising:
providing by the test system an indication of a scan chain test of the plurality of scan chain tests providing a latest time of occurrence of the variation with the respect to the specific test time.

* * * * *